US007642098B2

(12) United States Patent
Bekker et al.

(10) Patent No.: US 7,642,098 B2
(45) Date of Patent: Jan. 5, 2010

(54) FERROMAGNETIC OR FERRIMAGNETIC LAYER, METHOD FOR THE PRODUCTION THEREOF, AND USE THEREOF

(75) Inventors: Viacheslav Bekker, Karlsruhe (DE); Harald Leiste, Weingarten (DE); Klaus Seemann, Durmersheim (DE); Stefan Zils, Ettlingen (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 260 days.

(21) Appl. No.: 11/910,633

(22) PCT Filed: Mar. 25, 2006

(86) PCT No.: PCT/EP2006/002756

§ 371 (c)(1),
(2), (4) Date: Oct. 4, 2007

(87) PCT Pub. No.: WO2006/105877

PCT Pub. Date: Oct. 12, 2006

(65) Prior Publication Data

US 2008/0160333 A1 Jul. 3, 2008

(30) Foreign Application Priority Data

Apr. 6, 2005 (DE) ........................ 10 2005 015 745

(51) Int. Cl.
*H01L 21/00* (2006.01)
*H01L 29/82* (2006.01)
*G11C 11/02* (2006.01)

(52) U.S. Cl. ........................... 438/3; 365/171; 257/421; 257/E43.006

(58) Field of Classification Search ................. 365/171; 257/421, E43.006; 438/3
See application file for complete search history.

(56) References Cited

U.S. PATENT DOCUMENTS 6,529,110 B2 3/2003 Fedeli et al.

FOREIGN PATENT DOCUMENTS

| | | |
|---|---|---|
| DE | 2701558 | 7/1978 |
| DE | 10062400 | 7/2002 |
| DE | 10102367 | 8/2002 |
| EP | 1039488 | 9/2000 |
| EP | 1168383 | 1/2002 |
| FR | 2773632 | 7/1999 |
| JP | 2004015038 | 1/2004 |

OTHER PUBLICATIONS

Kazuhisa Fujimoto et al. "Bloch Line Propagation with Co-Pt Bit Patterns in Stripe Domains Confined by Grooves", IEEE Transactions on Magnetics, vol. 28, No. 6, Nov. 1992, pp. 3350-3354, XP002388701.

D. Klein et al. "Block line memory: Dams for stripe domain confinement", Journal of Applied Physics, vol. 57, No. 1, Apr. 15, 1985, pp. 4071-4072, XP002388700.

S. Methfessel et al. "Domain Walls in Thin Ni-Fe Films", IBM Journal of Research and Development, vol. 4, No. 2, Apr. 1960, pp. 96-106, XP002388702.

*Primary Examiner*—Evan Pert
(74) *Attorney, Agent, or Firm*—Darby & Darby

(57) ABSTRACT

A film and method of preparing a film. The film is made of at least one of ferromagnetic and ferrimagnetic material. An elongated slot is included in the material and is operable to control the domain structure of the material. The depth of the elongated slot is the same as the thickness of the film and the width of the elongated slot is greater than an exchange length of the material. The slot is free from contact with any side of the film.

20 Claims, 4 Drawing Sheets

FERROMAGNETIC OR FERRIMAGNETIC LAYER, METHOD FOR THE PRODUCTION THEREOF, AND USE THEREOF

CROSS REFERENCE TO RELATED APPLICATIONS

This is a U.S. National Phase application under 35 U.S.C. §371 of International Application No. PCT/EP2006/002756, filed Mar. 25, 2006 and claims the benefit of German Patent Application No. 10 2005 015 745.9 filed on Apr. 6, 2005. The International Application was published in German on Oct. 12, 2006 as WO 2006/105877 under PCT Article 21 (2).

FIELD OF THE INVENTION

The present invention relates to a thin ferro- or ferrimagnetic film, and to a method for the preparation and use thereof.

BACKGROUND

Passive or active electronic components may include ferro- or ferrimagnetic thin-film elements which perform an important function for the components. To ensure the functioning of such a ferro- or ferrimagnetic element, it is often beneficial to provide a specific, defined magnetic domain structure. The domain structure formed in thin films by spontaneous magnetization depends first and foremost on minimization of the stray field. For that reason, it is often not possible to control the domain structure, particularly when the material properties are not constant across the film.

On the other hand, the ability to control the domain structure, and to spatially and temporally stabilize the same constitute fundamental preconditions of magnetoelectronic or spintronic components, particularly in the area of high-frequency technology, sensor technology, storage media and electronics.

European Patent Application EP 1 168 383 A1 and U.S. Pat. No. 6,529,110 B2 describe the division of microstructures into individual sections. To this end, an elongated, magnetic thin-film core located inside of a solenoid is divided into a plurality of square or rectangular sections, the thin-film core being divided perpendicularly to the solenoid axis. With this arrangement a completely separated structural configuration leads to relatively unstable domain structures whose formation is dependent on the external geometry and is not directly controllable.

Thus, an aspect of the present invention is to provide a ferro- or ferrimagnetic film, and a method for the preparation and use thereof, that will overcome the aforementioned. It is an aspect, in particular, to provide a ferro- or ferrimagnetic film in which the domain structure is substantially controllable.

SUMMARY

The invention provides a film and method of preparing a film. The film is made of at least one of ferromagnetic and ferrimagnetic material. An elongated slot is included in the material and is operable to control the domain structure of the material. The depth of the elongated slot is the same as the thickness of the film and the width of the elongated slot is greater than an exchange length of the material. The slot is free from contact with any side of the film.

BRIEF DESCRIPTION OF THE DRAWINGS

The present invention is explained in greater detail in the following with reference to exemplary embodiments with reference to the following FIGS. 1-4, in which.

a) following spontaneous magnetization;

b) and subsequent heat treatment in the external magnetic field, in each case without a slot in accordance with the present invention;

c) following spontaneous magnetization, including a slot in accordance with the present invention.

Figure 2:
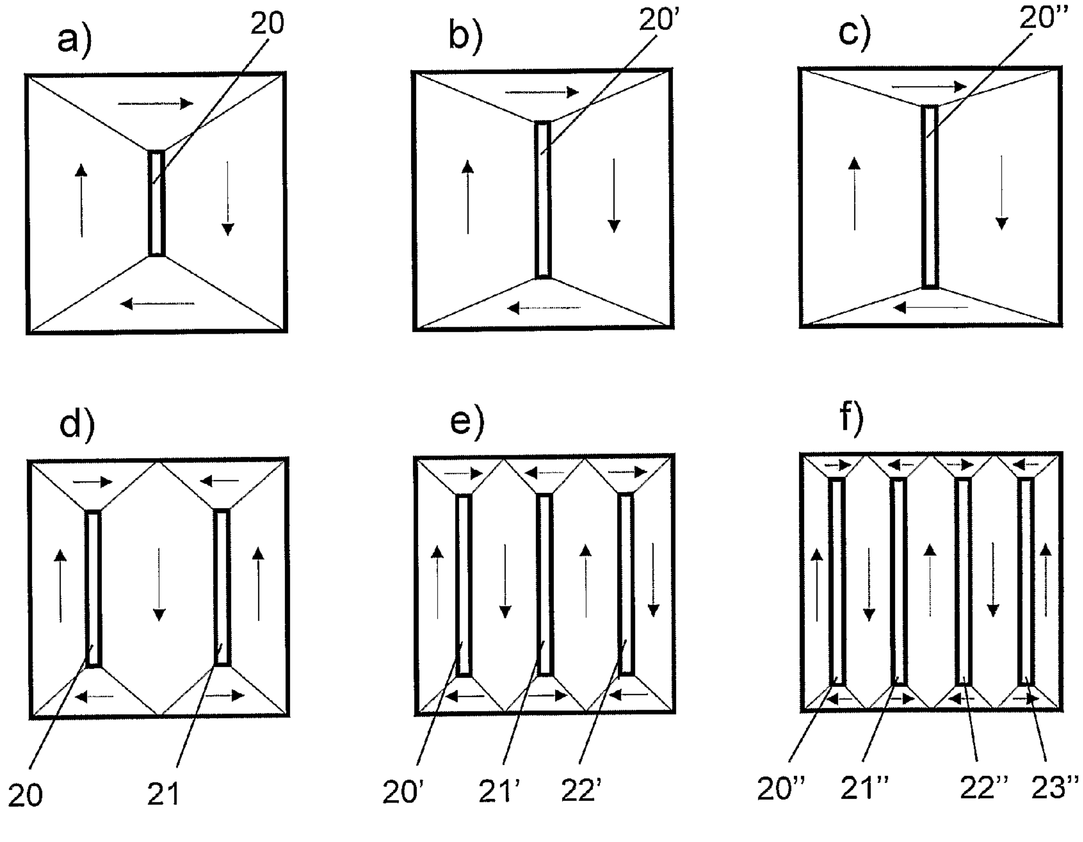

FIG. 2 is a schematic representation showing the influence of the length of a slot on the magnetization in the film in a)-c) and the influence of the length of a slot on the magnetization in the film, given a simultaneous increase in the number of slots in d)-f).

Figure 3:
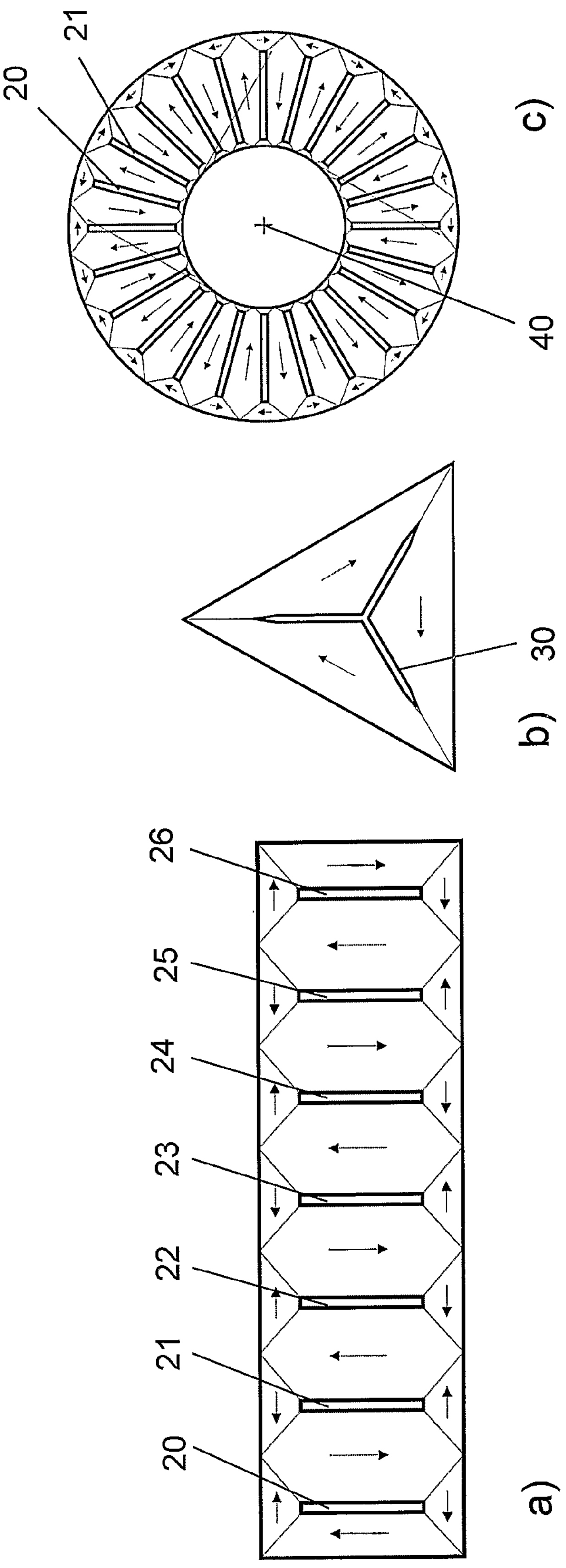

FIG. 3 is a schematic representation of various geometries of the configuration of slots according to the present invention:

a) uniaxial configuration;

b) triangular configuration;

c) annular configuration.

Figure 4:
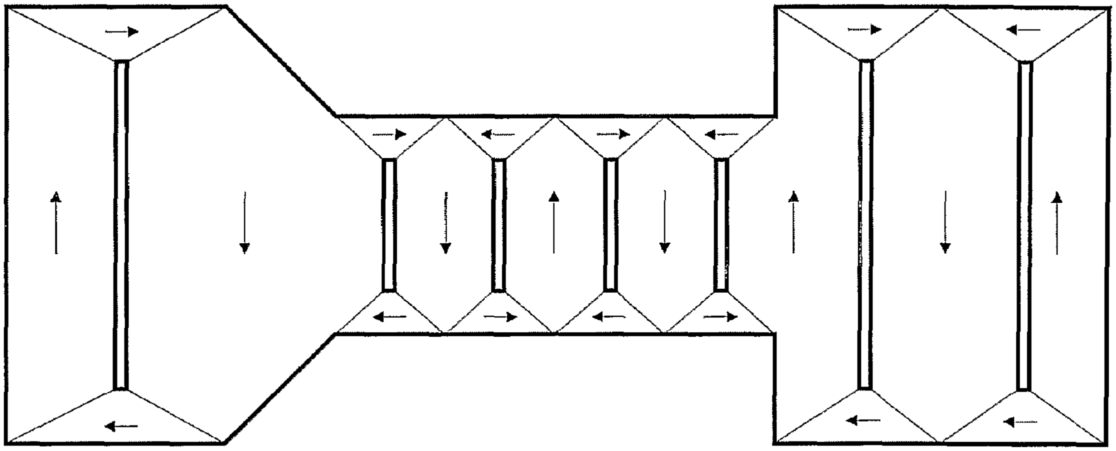

FIG. 4 is a schematic representation of the example of a configuration of various slots according to the present invention.

The present invention influences the orientation of domain structure by introducing one or more elongated slots into a ferro- or ferrimagnetic thin film. This controllable domain structure is pivotal to the magnetization-dependent function of a component which includes a film in accordance with the present invention. A film provided with slots in this manner renders possible a linear magnetization characteristic, since domain wall motions are largely prevented.

Domains, whose magnetization direction does not correspond to the required direction, and domain walls constitute regions of high losses, due, for example, to migration movements in the alternating electric field. A film without slots forms a domain structure having expanded domain walls and large domain regions having ineffectively oriented magnetization directions. By using slots in accordance with the present invention, the region of oriented magnetization is substantially enlarged, the domain wall volume reduced, and the domain wall motion reduced as well. Thus, the selective orientation of domain magnetization is made possible.

A film according to the present invention made of a ferro- or ferrimagnetic material may be applied directly to a substrate, or via one or a plurality of additional, electrically insulating, semiconductive or conductive non-ferro- or non-ferrimagnetic or other ferro- or ferrimagnetic intermediate layers, to a substrate. The film may have a thickness of between 10 nm and 10 μm.

In addition, a film according to the present invention includes one or a plurality of slots that have an elongated shape and, therefore, a defined longitudinal axis. The depth of the slot or of the slots corresponds to the thickness of the film in question, and the width thereof is greater than the exchange length of the ferro- or ferrimagnetic material that is typically within the range of between 10 to 100 nm. The slots are placed in such a way that no slot contacts a side (edge) of the film, thereby potentially dividing the film into a plurality of sections. Additionally, no current- or voltage-conducting printed conductors are configured to extend through the slot.

The length of the slots may adapted for the geometry of the film, such as in the case of rectangles, squares, strips, triangles or rings. In one embodiment, the sides of the film span a rectangle, and the longitudinal axis of the at least one slot is disposed substantially in parallel to two opposing sides of the rectangle. In one embodiment, the length of each slot may be between 0.1 and 0.85 times one side of the film which extends substantially in parallel to the longitudinal axis of the slot in question. In another embodiment the length of each slot may be between 0.2 and 0.75 times one side of the film which extends substantially in parallel to the longitudinal axis of the slot in question.

The distance between two adjacent slots in one predefined geometry is dependent on the material and thickness of the film. Its upper limit can be determined by the formation of additional domains between these two slots, and its lower limit by the increase in the inactive volume taken up by the additional slots. An optimal distance is preferably selected therebetween by taking into consideration the reduction in transverse magnetization and the simultaneous loss of surface area on the film that result from the placement of more slots.

A ferro- or ferrimagnetic film in accordance with the present invention may be produced using a thin-film method. The film applied using such a method can be structured in regions using microstructuring techniques, and one or more slots can be introduced in the process. Accordingly, established methods, such as ion beam etching, plasma jet etching, reactive ionic etching, wet chemical etching or mechanical ablation, come under consideration. The thereby produced structures may have any given geometrical shape, for example square, rectangular, round, elliptical or annular.

The desired domain structure is produced spontaneously when appropriate slot geometries are used, thus without any supplementary heat treatment. However, in an embodiment, an induced anisotropy is impressed to an even greater degree by a subsequent heat treatment of the film with or without the application of an external magnetic field. Generally, however, in regions of the film slotted in accordance with the present invention, heat treatment of the film is not required, nor is the external magnetic field during the heat treatment for impressing a uniaxial anisotropy.

Thus, the present invention makes it possible to selectively control magnetic domains in ferro- or ferrimagnetic films having any given external geometries, a high proportion of selectively oriented regions being produced within the film. It is also possible to orient the domains in any given geometric thin-film structures. It is thus possible to selectively control the permeability and the magnetization characteristics of magnetic film structures as a function of the domain structure.

Films in accordance with the present invention are suited for use in magnetoelectronic and spintronic components, particularly in the area of high-frequency technology, sensor technology, storage media and electronics.

Using reactive magnetron sputtering, a plane thin film 10 of the ferromagnetic material FeCoTaN is deposited onto a substrate having square lateral dimensions of 20 μm×20 μm. The thickness of film 10 is 100 nm and is thus 200 times smaller than the edge length. In a film 10 of this kind, a domain structure forms spontaneously, as shown schematically by domains 11, 12, 13, and 14 in FIG. 1*a*). In this context, the domains have equal magnetization values.

For certain applications, there may be a preferred direction of magnetization in the film. In the case of uniaxial anisotropy, it is intended that two opposite magnetization directions result in respective adjacent regions of the film, while the proportion of magnetizations orthogonal thereto be as low as possible. These requirements are able to be met by increasing the volume fraction of favorably oriented regions 11, 13 and thus, at the same time, by correspondingly reducing the volume fraction of regions 12, 14 which are orthogonal thereto and thus unfavorably oriented.

Figure 1:
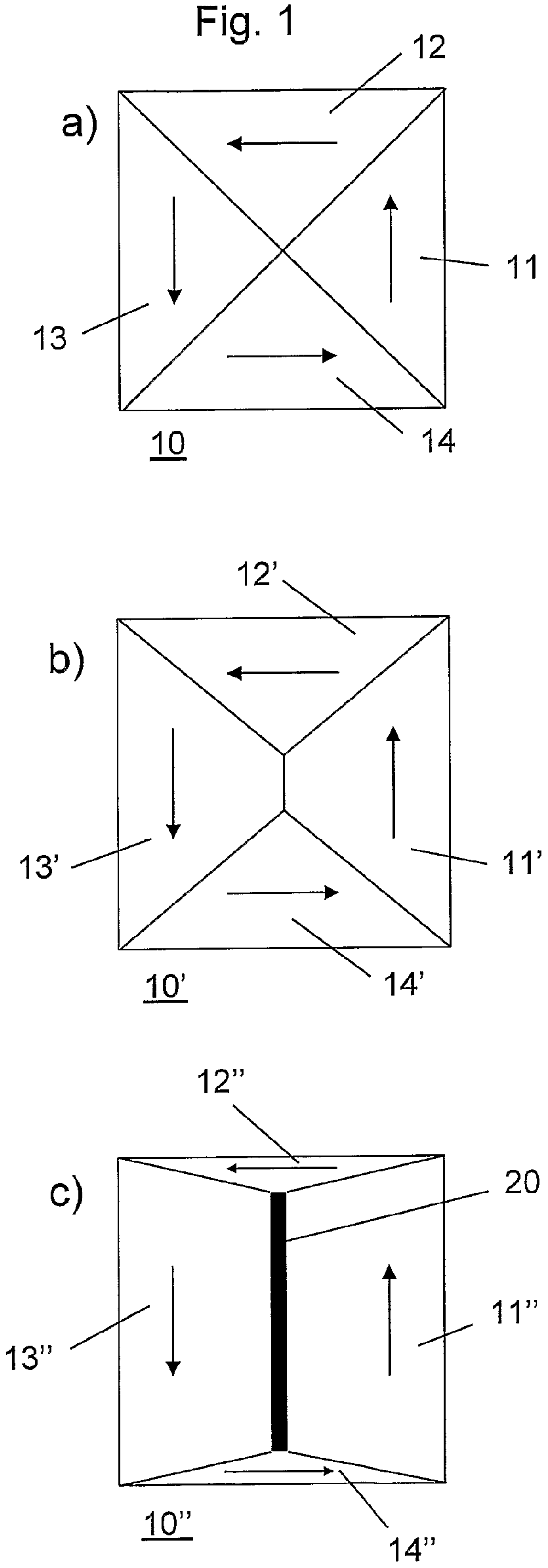
FIG. 1 is a schematic representation of the magnetization of a ferro- or ferrimagnetic film.

In response to a heat treatment to film 10' in an external magnetic field, the size of domains 11, 13 is increased to a certain degree to domains 11', 13' upon deactivation of the external field, as shown in FIG. 1*b*).

In accordance with the invention, if a slot 20, whose orientation extends in parallel to the orientation of the magnetization in domains 11, 13, is introduced into ferromagnetic film 10", domains 11, 13 are able to be increased in size, beyond the previous measure, to domains 11", 13", as is discernible in FIG. 1*c*). As a result, the volume fraction of domains 11", 13" having the desired magnetization direction is substantially higher than that of domains 11, 13, while the volume fraction of domains 12, 14, which are disposed orthogonally thereto and thus unfavorably oriented, is substantially lower than that of domains 12", 14".

FIGS. 2 *a*) through *c*) show the influence of the increasing length of each individual slot 20, 20', 20" on the magnetization in the ferromagnetic film. It is apparent herefrom that the volume fraction of those regions, which are disposed in parallel to the longitudinal axis of the respective one slot 20, 20', 20" and which are thus favorably oriented, becomes increasingly greater and, consequently, at the same time, the volume fraction of those regions, which are disposed orthogonally to the longitudinal axis of the respective one slot 20, 20', 20" and are thus unfavorably oriented, becomes proportionately smaller. The same effect is observed when, as illustrated in FIG. 2 *d*) through *f*), the number of slots oriented mutually in parallel in each case increases from 20, 21 to 20', 21', 22' and finally to 20", 21", 22", and 23".

FIGS. 3*a* through 3*c* schematically illustrates various geometries of the slots configured in accordance with the present invention. FIG. 3*a*) shows a uniaxial configuration including seven slots 20 through 26 oriented mutually in parallel. FIG. 3*b*) shows a triangular configuration including one slot 30 that fans out in three directions, in each case forming a mutual angle of approximately 120°. FIG. 3*c*) shows an annular configuration including a multiplicity of slots 20, 21, etc., whose longitudinal axes each extend radially to center 40 of a circle defined by the sides of the ring.

FIG. 4 schematically illustrates an example of a configuration of various slots according to the present invention. A configuration of this kind illustrates the controllability of magnetic domains in any given geometries.

The invention claimed is:

1. A film comprising:

at least one of a ferromagnetic and ferromagnetic material; and at least one elongated slot in the material and operable to control a domain structure of the material, a depth of the at least one elongated slot corresponding to a thickness of the film, a width of the at least one elongated slot being greater than an exchange length of the material, and the at least one elongated slot being free from contact with any side of the film.

2. The film as recited in claim 1 wherein the film is disposed on a substrate.

3. The film as recited in claim 1 wherein the at least one elongated slot is free of current conducting printed conductors and voltage conducting printed conductors extending therethrough.

4. The film as recited in claim 2 wherein the at least one elongated slot is free of current conducting printed conductors and voltage conducting printed conductors extending therethrough.

5. The film as recited in claim 1 wherein the film includes four sides spanning a rectangle, and wherein a longitudinal axis of the at least one elongated slot is parallel to a first of the sides.

6. The film as recited in claim 3 wherein the film includes four sides in a rectangle, and wherein the at least one elongated slot is parallel to a first side of the rectangle.

7. The film as recited in claim 5 wherein a length of the at least one elongated slot is between 0.1 and 0.85 times a length of the first side.

8. The film as recited in claim 6 wherein a length of the at least one elongated slot is between 0.1 and 0.85 times a length of the first side.

9. The film as recited in claim 1 wherein the thickness of the film is between 10 nm and 10 μm.

10. The film as recited in claim 7 wherein the thickness of the film is between 10 nm and 10 μm.

11. The film as recited in claim 1 wherein the film is disposed on another film, and the another film is disposed on a substrate.

12. The film as recited in claim 1 further comprising a magnetoelectronic or spintronic component.

13. A method for preparing a film comprising:

providing, by a thin film method, a film comprising at least one of a ferromagnetic and ferrimagnetic material; and providing an elongated slot in the film by at least one of ion beam etching, plasma jet etching, reactive ion etching, wet chemical etching and mechanical ablation, wherein the slot has a depth corresponding to a thickness of the film and a width greater than an exchange length of the material, and is free from contact with any edge of the film.

14. The method recited in claim 13 further comprising heat treating the film.

15. The method recited in claim 13 further comprising applying an external magnetic field to the film.

16. The method recited in claim 14 further comprising applying an external magnetic field to the film.

17. The method recited in claim 13 wherein the film is provided on a substrate.

18. The method recited in claim 13 wherein the film has a thickness of between 10 μm and 10 nm.

19. The method recited in claim 13 wherein the film is provided as a rectangle and the slot is provided so that a longitudinal axis of the slot is parallel to a first side of the rectangle.

20. The method recited in claim 19 wherein a length of the slot is between 0.1 and 0.85 times a length of the first side of the rectangle.

* * * * *